(12) United States Patent
Beer et al.

(10) Patent No.: US 10,102,967 B2
(45) Date of Patent: Oct. 16, 2018

(54) METHOD OF MANUFACTURING AN INDUCTOR CORE FOR A CHIP ASSEMBLY AND CHIP ASSEMBLY

(71) Applicant: Infineon Technologies AG, Neubiberg (DE)

(72) Inventors: Gottfried Beer, Nittendorf (DE); Bernhard Knott, Neumarkt (DE); Rainer Leuschner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 296 days.

(21) Appl. No.: 14/571,316

(22) Filed: Dec. 16, 2014

(65) Prior Publication Data
US 2015/0170835 A1    Jun. 18, 2015

(30) Foreign Application Priority Data

Dec. 16, 2013 (DE) .......................... 10 2013 114 155

(51) Int. Cl.
| | |
|---|---|
| *H01F 5/00* | (2006.01) |
| *H01F 27/28* | (2006.01) |
| *H01F 41/02* | (2006.01) |
| *H01F 17/00* | (2006.01) |
| *H01F 41/04* | (2006.01) |
| *H01L 23/64* | (2006.01) |
| *H01L 23/00* | (2006.01) |

(52) U.S. Cl.
CPC ..... *H01F 41/0206* (2013.01); *H01F 17/0013* (2013.01); *H01F 41/046* (2013.01); *H01L 23/645* (2013.01); *H01L 24/19* (2013.01); *H01L 24/97* (2013.01); *H01F 2017/0066* (2013.01); *H01L 2224/04105* (2013.01); *H01L 2224/24195* (2013.01); *H01L 2224/32225* (2013.01); *H01L 2224/32245* (2013.01); *H01L 2224/73267* (2013.01); *H01L 2224/97* (2013.01); *H01L 2924/13055* (2013.01); *H01L 2924/15311* (2013.01); *H01L 2924/19042* (2013.01); *H01L 2924/19105* (2013.01); *Y10T 29/4902* (2015.01)

(58) Field of Classification Search
CPC .................................. H01F 5/00; H01F 27/28
USPC .................................. 336/200, 232; 257/531
See application file for complete search history.

(56) References Cited

U.S. PATENT DOCUMENTS

| | | | | |
|---|---|---|---|---|
| 2006/0109023 | A1* | 5/2006 | Babcock .......... | G01R 31/31926 257/531 |
| 2009/0167477 | A1* | 7/2009 | Feng .................. | H01F 17/0033 336/200 |
| 2014/0264734 | A1* | 9/2014 | Luo ....................... | H01L 23/147 257/531 |

FOREIGN PATENT DOCUMENTS

| | | | | |
|---|---|---|---|---|
| CN | 1530972 A | 9/2004 | | |
| EP | 1983467 A | 10/2008 | | |
| EP | 1983467 A1 | * 10/2008 | ....... | G06K 19/07749 |
| EP | 1460654 B1 | 9/2009 | | |

* cited by examiner

*Primary Examiner* — Tsz Chan

(57) ABSTRACT

A method for manufacturing an inductor core is developed, wherein the method comprises the following: Forming a first electrical conductor on a first surface of a plate-shaped magnetic core; forming a second electrical conductor on a second surface of the plate-shaped magnetic core, which is opposite the first surface; and forming the inductor core by dicing the plate-shaped magnetic core transverse to the first electrical conductor and second electrical conductor.

6 Claims, 4 Drawing Sheets

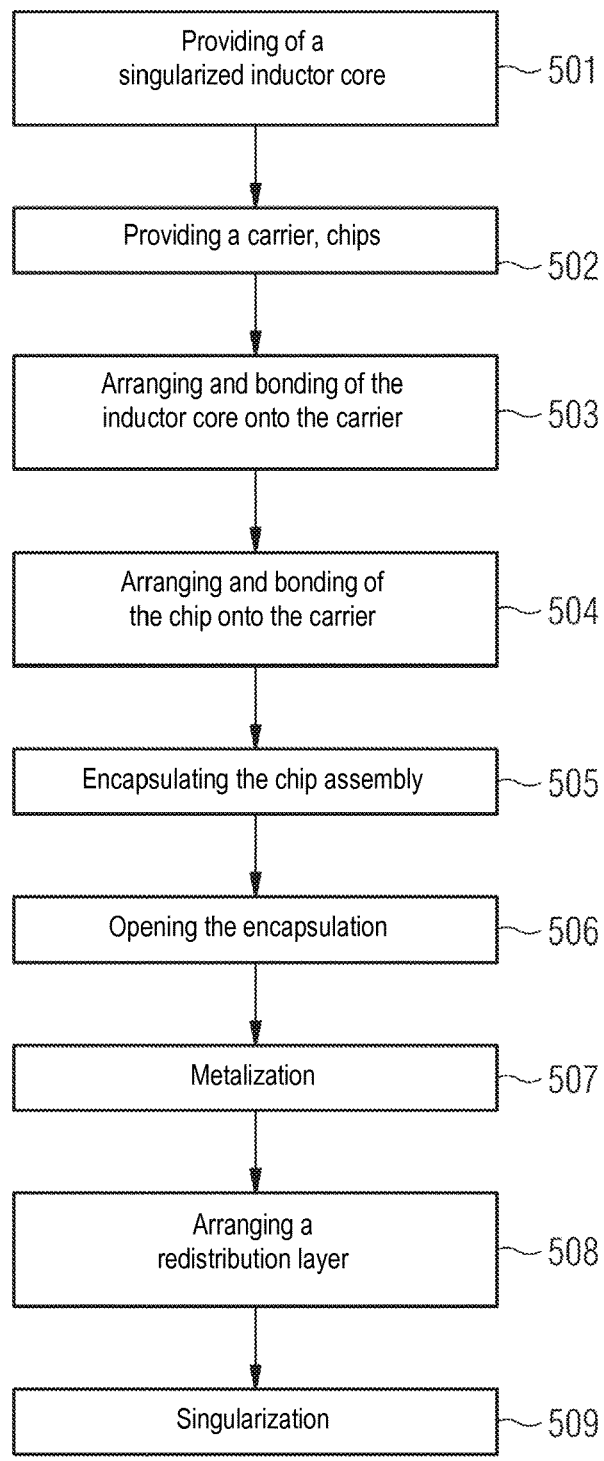

METHOD OF MANUFACTURING AN INDUCTOR CORE FOR A CHIP ASSEMBLY AND CHIP ASSEMBLY

TECHNICAL FIELD

Various exemplary embodiments generally relate to a method for producing inductor cores for a chip assembly, methods for assembling a chip assembly and such a chip assembly.

BACKGROUND

The chip embedding technology may include placing a chip on a board, e.g. a system carrier, a temporary carrier or a PCB (printed circuit board), and the adhesion of a sealing or encapsulating material over the chip and on the board. Such embedded chip assemblies are used in a variety of technical fields and include a variety of components. For example, such embedded chip assemblies can be used in areas of RF technology, wireless communication, and logic. Another field is, e.g. transducers (e.g. DC-DC converters) to reduce the size and to reduce electrical parasitics. However, the integration of the passive components in such transducers is difficult because of the relatively high capacitance and inductance values required, wherein the inductances should be formed by inductors, whose ohmic and magnetic losses are as low as possible.

In the prior art, different approaches to designing such inductors are known. For example, discrete inductors, which are assembled and electrically connected to a printed circuit board (PCB), are used. Embedded inductors or inductances, which, however, are relatively large and are difficult to manufacture, are also known.

SUMMARY

Various exemplary embodiments provide a method for manufacturing an inductor core, wherein the method comprises the following: Forming a first electrical conductor on a first surface of a plate-shaped magnetic core; forming a second electrical conductor on a second surface of the plate-shaped magnetic core, which is opposite the first surface; and forming the inductor core by dicing the plate-shaped magnetic core transverse to the first electrical conductor and second electrical conductor.

Various exemplary embodiments provide a method for manufacturing a chip assembly, wherein the method comprises: Assembly of at least one chip with at least one contact pad on a first part of a carrier; assembly of an inductor core, which is produced according to an exemplary embodiment, on a second part of the carrier such that the first surface of the at least one inductor core is arranged perpendicular to a main surface of the carrier; and contacting the at least one contact pad with one of the first or second electrical conductors of the inductor core.

Various exemplary embodiments provide a chip assembly, which comprises: a carrier having a first part and a second part; at least one chip with at least one contact pad, which is assembled on the first part of the carrier; an inductor core comprising a magnetic core with a first conductor on a first surface of the magnetic core and a second conductor on a second surface of the magnetic core, which is opposite the first surface of the magnetic core; wherein the inductor core is assembled on the second part of the carrier; wherein the first conductor and the second conductor are electrically connected to one another by the at least one conductor track; wherein the first surface of the inductor core is perpendicular to a side wall of the chip; and wherein the at least one contact pad of the chip is electrically connected with one of the first and the second electrical conductors of the inductor core by an intermediate conductor.

Various exemplary embodiments provide a chip assembly, which comprises: at least one chip with at least one contact pad; an inductor core comprising a magnetic core and a first conductor on a first surface of the magnetic core and a second conductor on a second surface of the magnetic core, which is opposite the first surface of the magnetic core; wherein the chip and the inductor core are embedded in an encapsulant and the first conductor and the second conductor are electrically connected to one another by a conductor track; wherein the at least one contact pad of the chip is electrically connected with one of the first and the second electrical conductors of the inductor core by an intermediate conductor.

In the following, specific exemplary embodiments of the method for manufacturing an inductor core, the method of making a chip assembly and the chip assembly will be described. The configurations of the specific exemplary embodiments can also be combined with each other.

In particular, the magnetic core may have or consist of a ferromagnetic material. For example, the ferromagnetic material may be iron or soft iron, ferrite, a nickel-iron alloy, iron-cobalt alloy, a niobium alloy, a neodymium alloy or a rare earth alloy. In particular, the first and the second electrical conductor may be applied, formed or assembled on dielectric layers on main surfaces of the plate-shaped magnetic core. Furthermore, the inductor core may be formed on only two sides of the electrical conductors, while the other four surfaces of the inductor core may be free of electrical conductors.

In particular, the chip may be a semiconductor chip. In particular, the chip assembly may also comprise switches, transistors, IGBTs, MMIC (monolithic microwave integrated chip), driver devices, controllers, capacitors and other electrical and/or electronic parts or components. Depending on the requirements, several inductor cores may be present in the chip assembly.

The term "inductor core" may refer to, in particular, a magnetic core for an inductor or an inductance, which already has some, but not all of the necessary conductor or conductor tracks, which are needed to form a coil around the magnetic core, i.e. to form a complete inductor or an inductance. In other words, it may be an intermediate product or an initial product by which the finished inductor can then be produced for a chip arrangement in a simple manner. Thus, it is to be distinguished from, in particular, an already fully formed inductor, which already includes, in particular, a fully formed coil, or its conductor tracks.

In particular, the dicing may be performed such that the plate-shaped magnetic core is diced along with the first electrical conductor and the second electrical conductor. Thus, multiple inductor cores with magnetic cores and electrical conductors may be produced on a single panel.

Forming or shaping of the electrical conductor or conductor tracks may be carried out by any known technique. For example, the conductor may be applied by PVD (physical vapor deposition), electroplating or laminating. The patterning of the conductor can be performed, e.g. in a semi-additive or subtractive manner. Preferably, the metal content in the saw-line is kept low by appropriate structures/breaks.

In particular, the inductor core may be arranged on the carrier or in the encapsulant (embedding compound, sealing compound) so that the first electric conductor is assembled adjacent to a side wall of the chip. Preferably, the conductor track, with which the first conductor and the second conductor of the inductor core embedded in the encapsulant are electrically connected to each other, is assembled on a main surface of the encapsulant. Preferably, the carrier may be formed by a one-piece carrier, so that the first part and the second part of the carrier each form an integral part of the carrier. Alternately, the carrier may also be formed by two separate parts, in which a first part forms a first partial carrier and a second part forms a second partial carrier. In particular, in addition to the at least one chip, other components, for example, other chips or other electronic components, can be assembled on the carrier. Preferably, the first and/or the second electrical conductor can also be arranged perpendicular to the one main surface of the carrier along with the perpendicular arrangement of the first surface of the inductor core with respect to the one main surface of the carrier or the encapsulant. Perpendicular may mean here, in particular, essentially perpendicular, i.e. the term may also be interpreted as a certain deviation, for example, between 80° and 100°.

The term "carrier" may refer to, in particular, a flat bearing structure, on which components of a chip assembly can be arranged or placed. Examples of carriers are substrates, wafers, leadframes or temporary carriers, i.e. carriers that are only used during the manufacturing process as auxiliary layers, and can be subsequently removed again. For example, an auxiliary carrier or temporary carrier, to which the chip and the inductor core are attached and which can be removed after coating with an encapsulant, can be used in embedded wafer level ball grid array (eWLB) technology.

According to one exemplary embodiment, an inductor core for a chip assembly is provided, comprising a plate-shaped magnetic core; and a first electrical conductor and a second electrical conductor, wherein the first electrical conductor is formed on a first surface of the plate-shaped magnetic core and the second electrical conductor is formed on a second surface, which is opposite the first surface.

By providing an inductor core whose two sides have electrical conductors, which can be parts of a coil, it is possible to transform the inductor core to an inductor or an inductance when arranging the inductor core on a carrier easily by, e.g. one-, two- or multilayer redistribution layers. For this purpose, the conductor tracks, provided in the redistribution layer, may electrically connect the electrical conductors that are still not electrically connected with each other within the inductor core, so that a coil or at least one conductor loop is formed around the magnetic core. Thus, it may easily be possible to create an inductor with a relatively high inductance.

According to a specific exemplary embodiment of the method for manufacturing an inductor core, dicing is carried out by saw-cutting the magnetic core provided with the conductors.

Saw-cutting may be an especially simple way to dice the magnetic core into smaller parts, so as to create multiple inductor cores. By applying this method, it may be possible to produce multiple inductor cores easily at the same time by applying or forming conductor tracks on a flat, plate-shaped magnetic core and by then dicing the magnetic core into several parts. In addition to or alternately to saw-cutting, other process steps may be performed to dice the magnetic core, for example, cut-off grinding, milling, punching, cutting can be carried out by laser or the like.

According to a specific exemplary embodiment of the method for producing an inductor core, multiple electrical conductors are assembled on the first surface, and multiple electrical conductors on the second surface.

In particular, the multiple conductor tracks are preferably applied side by side, i.e. as a single layer. This can also be multi-layered.

In particular, some or all of the multiple electrical conductors may be applied on the first surface and/or on the second surface parallel to or at least substantially parallel to each other. The multiple electrical conductors may also be assembled on the first surface parallel to or at least substantially parallel to the multiple electrical conductors on the second surface.

According to a specific exemplary embodiment of the method for manufacturing an inductor core, the magnetic core comprises multiple layers.

In particular, the magnetic core may form a multi-layered structure. The individual layers may have or consist of a ferromagnetic material and be electrically insulated from each other. For example, the magnetic core may have multiple thin laminated metal layers, by which inductive losses may be reduced. For example, magnetic layers can also be deposited on the plate-shaped magnetic core by electro-plating or PVD, or can convey the magnetic properties to the core. It should also be noted that the plate-shaped magnetic core may have a wafer or a polygonal shape. Plate-shaped in this context means, in particular, that the two main surfaces (top/bottom) run parallel or are at least substantially coplanar.

According to a specific exemplary embodiment of the method for producing an inductor core, electrical insulation is sandwiched between the electrical conductors and the magnetic core.

According to a specific exemplary embodiment of the method for manufacturing an inductor core, the magnetic core comprises a sintered metal powder.

Formation of the magnetic core using a subsequently sintered metal powder, may provide, in particular, a simple way to achieve low inductive losses by the fact that such a magnetic core has a higher resistance.

According to a specific exemplary embodiment of the method for producing a chip assembly, the carrier is a temporary carrier.

In particular, the temporary carrier may be subsequently removed during further processing. The removal of the temporary carrier may be carried out, in particular, after encapsulation.

According to a specific exemplary embodiment of the method for producing a chip assembly, the carrier comprises at least one conductor track, and the inductor core is arranged on the carrier such that the conductor track electrically connects the first electrical conductor and the second electrical conductor of the inductor core.

In this case, the carrier may not be a temporary carrier but a permanent carrier or substrate, which remains in the chip assembly formed, i.e. for example, a portion of the encapsulated chip assembly. In particular, the carrier may comprise multiple conductor tracks, which are suitable to connect multiple electrical conductors on the first surface of the magnetic core with multiple electrical conductors on the second surface of the magnetic core. In particular, the inductor core may be bonded onto the carrier. In this way, it may easily be possible to electrically connect the first electrical conductor on the first surface of the inductor core to the second electrical conductor on the second surface of the magnetic core. Thus, a continuous conductor, which may form a coil or at least one portion of a coil may be formed. Where multiple electrical conductors are provided on the first surface of the magnetic core and multiple electrical conductors on the second surface of the magnetic core, a corresponding number of electrical conductor tracks may be formed in or on the carrier, in particular, in the second part of the carrier, wherein each of the conductor tracks electrically connects an electrical conductor on the first surface of the magnetic core with an electrical conductor on the second surface of the magnetic core. In this way, a coil having multiple turns or windings can be formed.

According to a specific exemplary embodiment of the method for producing a chip assembly, the chip assembly is encapsulated.

In particular, the chip may be encapsulated by casting, molding or lamination. By encapsulation, in particular, an (embedding) substrate, which may constitute the encapsulation of the chip assembly, may be formed. Following the encapsulation, the carrier, in particular, a temporary carrier, may optionally be removed.

According to a specific exemplary embodiment of the method for producing a chip assembly, the encapsulation is partially opened.

In particular, vias or through-holes are formed, which may be adapted to establish contact with contact pads or contacts on the chip, the inductor core, the carrier (e.g. a leadframe) or other components of the chip assembly. The opening may be performed, e.g. by laser drilling, etching, or similar methods, and may form a structured encapsulation. Subsequently, a metal layer such as a copper or aluminum layer can be formed, which can serve to establish contact with the chip assembly.

According to a specific exemplary embodiment of the method for producing a chip assembly, the method also comprises the application of a redistribution layer on the at least one inductor core such that the first electrical conductor on the first surface of the magnetic core is electrically connected with the second conductor on the second surface of the magnetic core.

In particular, the redistribution layer may also have an intermediate conductor that electrically connects the first conductor with the contact pad. For example, one or more redistribution layers are preferably applied to the partially opened encapsulation. In addition, other components, e.g. bridges, can be mounted. Alternately, one or more redistribution layers may also be applied prior to encapsulation. The carrier may be, in particular, a leadframe, a printed circuit board, a ball grid array (BGA) or an embedded wafer level ball grid array (eWLB).

Thus, it is possible to provide an inductor core easily, which is produced by a method according to an exemplary embodiment and which still does not have a complete coil or windings around its magnet core, with a full coil or its windings. In particular, this may be performed by a redistribution layer, which is formed in the area corresponding to the conductors of the inductor core, and is formed in an area other than the usual redistribution layer.

According to a specific exemplary embodiment of the chip assembly, the inductor core comprises a set of electrical conductors, which is divided into a first plurality of electrical conductors and a second plurality of electrical conductors, wherein the first plurality of electrical conductors is arranged on the first surface and the second plurality of electrical conductors is arranged on the second surface.

In particular, the electrical conductors of the first batch or the first subsets may be aligned parallel or at least substantially parallel to each other and/or the electrical conductors of the second batch or the second subsets may be aligned parallel to each other. In particular, the electrical conductors may be electrically insulated from each other.

According to a specific exemplary embodiment of the chip assembly, at least one of the first plurality of electrical conductors is electrically connected with two of the second plurality of electrical conductors.

In particular, two of the second plurality of electrical conductors may be arranged side by side. Further, the connection to one of the two electrical conductors may be established on one side or at an end of one of the first plurality of electrical conductors, while the connection to the other one of the two electrical conductors may be established on the other side or at the other end of the conductor of the first plurality of conductors. In particular, this may also inversely apply to the electrical conductors of the second plurality of electrical conductors. Thus, a coil having multiple windings, transformers or coil loops can be easily formed using the set of electrical conductors.

According to a specific exemplary embodiment of the chip assembly, this also comprises at least one redistribution layer arranged in the encapsulant. In particular, the redistribution layer may be formed in the encapsulant. This can be accomplished, for example in the eWLB technology, by assembling a redistribution layer on a temporary carrier on which the chip and/or the inductor core is arranged. This temporary carrier is then at least partially embedded in a sealing compound or an encapsulant and is removed after embedding, whereby a so-called artificial wafer is formed.

BRIEF DESCRIPTION OF THE DRAWINGS

In the drawings, the same reference signs generally refer to the same parts in the different views. The drawings are not necessarily to scale; instead, the general emphasis is on illustrating the principles of the invention. In the following description, various exemplary embodiments of the invention are described with reference to the following drawings. In the drawings:

FIG. 5 is a flow chart for another method for producing a chip assembly according to an exemplary embodiment.

DETAILED DESCRIPTION

The following detailed description refers to the accompanying drawings, which illustrate specific details and exemplary embodiments in which the invention may be realized.

The word "exemplary" is used here to mean "cited by example, case, or illustration." Any exemplary embodiment or any design that will be used herein as "exemplary" need not necessarily be interpreted as preferred or advantageous over other exemplary embodiments or designs.

Figure 1:
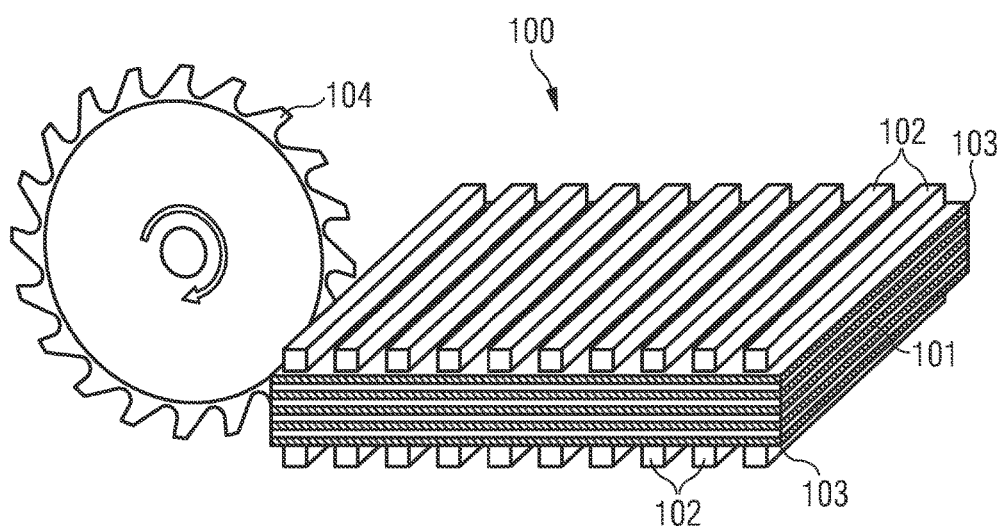
FIG. 1 illustrates an inductor core according to an exemplary embodiment.

FIG. 1 illustrates an inductor core 100 which has a plate-shaped magnetic core 101, on which a plurality of electrical conductors 102 is formed. The electrical conductors 102 in this case are formed on the two main surfaces of the plate-shaped magnetic core and are arranged substantially parallel to each other. The magnetic core here may consist of any suitable magnetic material or alloy, such as soft iron, ferrite, nickel-iron alloy, iron-cobalt alloys, niobium alloys, neodymium alloys, rare earth alloys, or other ferromagnetic material. Preferably, a layer of electrically insulating or dielectric material 103 is sandwiched between the electrical conductors 102 and the magnetic core 101.

The thickness of the magnetic core does not play any significant role and can be customized. To reduce the inductive losses, the magnetic core can be made of a plurality of thin layers, in particular, e.g. a thickness pf between 2 µm and 15 µm or thin films, which are mutually electrically insulated. Alternately, the magnetic core may be made of a subsequently sintered metal powder, which also reduces eddy currents and the inductive losses of the inductor formed.

FIG. 1 illustrates a still undiced magnetic core with a plurality of electrical conductors. This can be diced after forming the electrical conductor, in order thus to obtain a plurality of inductor cores, or inductor cores of the required or desired size. The dicing operation is indicated in this case in FIG. 1 by a schematic circular saw 104. However, the dicing, division or separation may be accomplished by any suitable process step. It should be noted that a fully formed inductor core has a magnetic core that has assembled conductors on two sides. In particular, the conductors may be formed on precisely two sides of the magnetic core. The conductors may be electrically insulated from each other to prevent a short circuit of either conductor. In another embodiment, the conductors are arranged in a plurality of layers in order to achieve a higher number of windings and/or a lower ohmic resistance.

Figure 2:
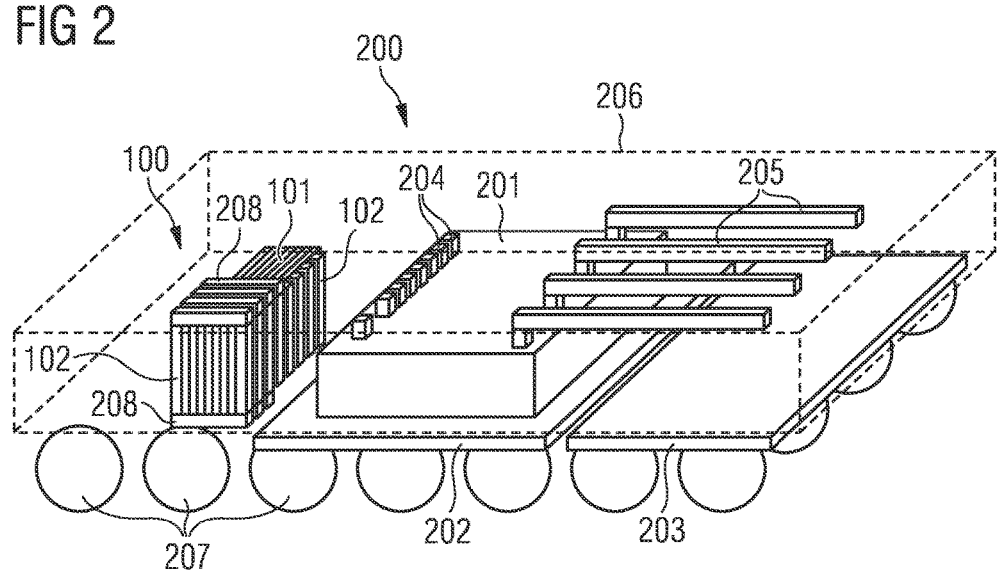
FIG. 2 illustrates a chip assembly according to an exemplary embodiment.

FIG. 2 illustrates a chip assembly according to an exemplary embodiment. In particular, FIG. 2 illustrates a chip assembly 200, which has a chip, for example, an electronic switch 201 as shown here, which is arranged on a carrier or substrate 202. The carrier 202 may be a printed circuit board (PCB) or similar, such as a leadframe 203. The chip 201 has a plurality of contact pads 204, which can be connected with other electrical or electronic components (not shown) by conductor tracks 205. The chip assembly 200 also includes an inductor core or an inductor 100. here, the inductor core 100 has a plurality of electrical conductors 102, which is formed on the side surfaces of the inductor core 100 as shown in FIG. 2. In particular, one of the surfaces, on which the electrical conductors 102 are formed, is adjacent to a side wall of the chip 201 and is assembled substantially perpendicular to a main surface of the carrier 202. As can be seen, the arrangement of the inductor core 100 in FIG. 2 results from the fact that the diced inductor core of FIG. 1 is rotated by 90 degrees.

On the upper and lower sides in FIG. 2, a plurality of conductor tracks 208, each of which connect two electrical conductors 102, is still assembled on the inductor core 100. These conductor tracks 208 may be, in particular, parts of a redistribution layer, which is not completely depicted in FIG. 2 for reasons of clarity. With the conductor tracks, the intermediate or semi-finished product of the inductor core shown in FIG. 1 is transformed to a complete inductor, i.e. a coil with a magnetic core.

The chip assembly 200 may also be encapsulated by an encapsulation or passivation material. After encapsulation, the encapsulation is opened again in some places in order to allow contact with electrical or electronic components of the chip assembly. Alternately, even during formation, the encapsulation may expose existing contacting pads or points, which are intended for external contact with the chip assembly. The encapsulation may be formed by a particular molding process and may form a substrate. Preferably, the encapsulation is formed prior to formation or arrangement of the redistribution layer. The encapsulation is indicated in FIG. 2 by the dashed line 206. The chip assembly may also be formed into a ball grid array 207.

Figure 3:
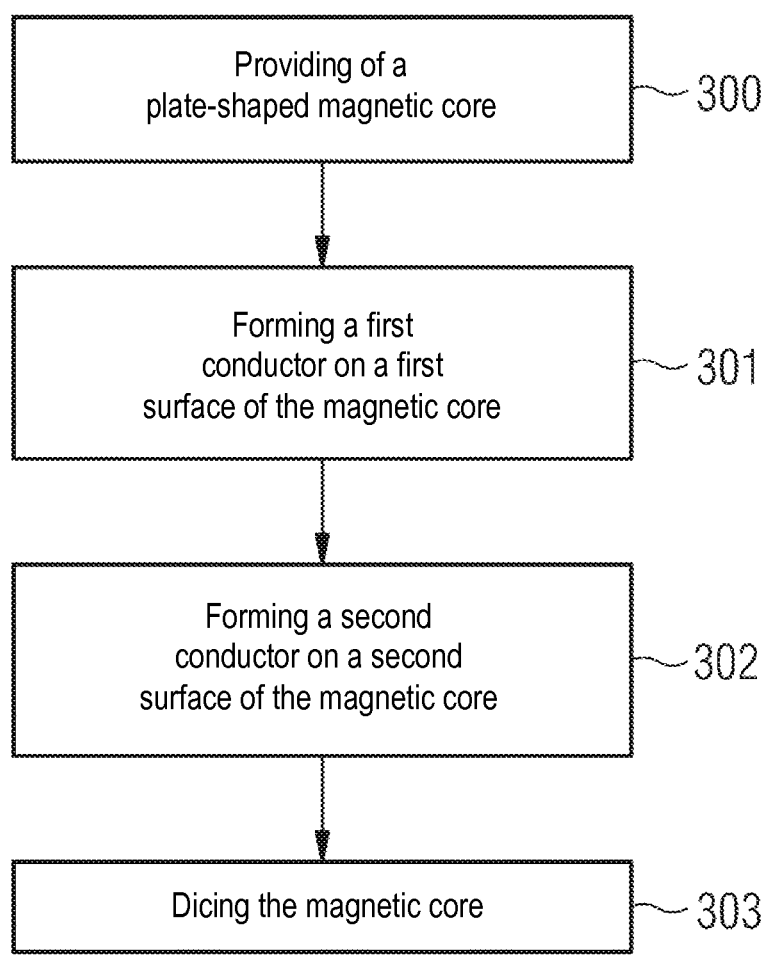
FIG. 3 is a flow chart for a method for producing an inductor core according to an exemplary embodiment.

FIG. 3 is a flow chart for a method for producing an inductor core according to an exemplary embodiment. The method comprises, in particular, the provision of a magnetic core (step 300), on which at least one first electrical conductor is formed on a first surface (step 301). Simultaneously or subsequently, a second electrical conductor is formed on a second surface of the magnetic core (step 302), wherein the second surface is opposite the first surface. According to another embodiment, a plurality of layers of electrical conductors and/or magnetic cores can be used. Preferably, it should be noted here that saw marks, i.e. paths along which cutting is subsequently performed, are largely free of metal layers (e.g. Cu layers). The magnetic core, with the conductors formed thereon, is subsequently diced (step 303), wherein a plurality of inductor cores may be prepared.

The inductor core can subsequently be used in a method for producing a chip assembly. In particular, it is arranged for this purpose in a first section or part of a carrier (for example, a carrier with a redistribution layer) with a conductor track, which then electrically connects the first conductor to the second conductor. At least one chip with at least one contact pad is assembled on another section or part of a chip carrier. Furthermore, another layer, preferably a redistribution layer, is arranged on the inductor core and the at least one chip, which in turn comprises conductor tracks for the connection of conductors of the inductor core with each other and with the contact pad of chip(s).

Figure 4:
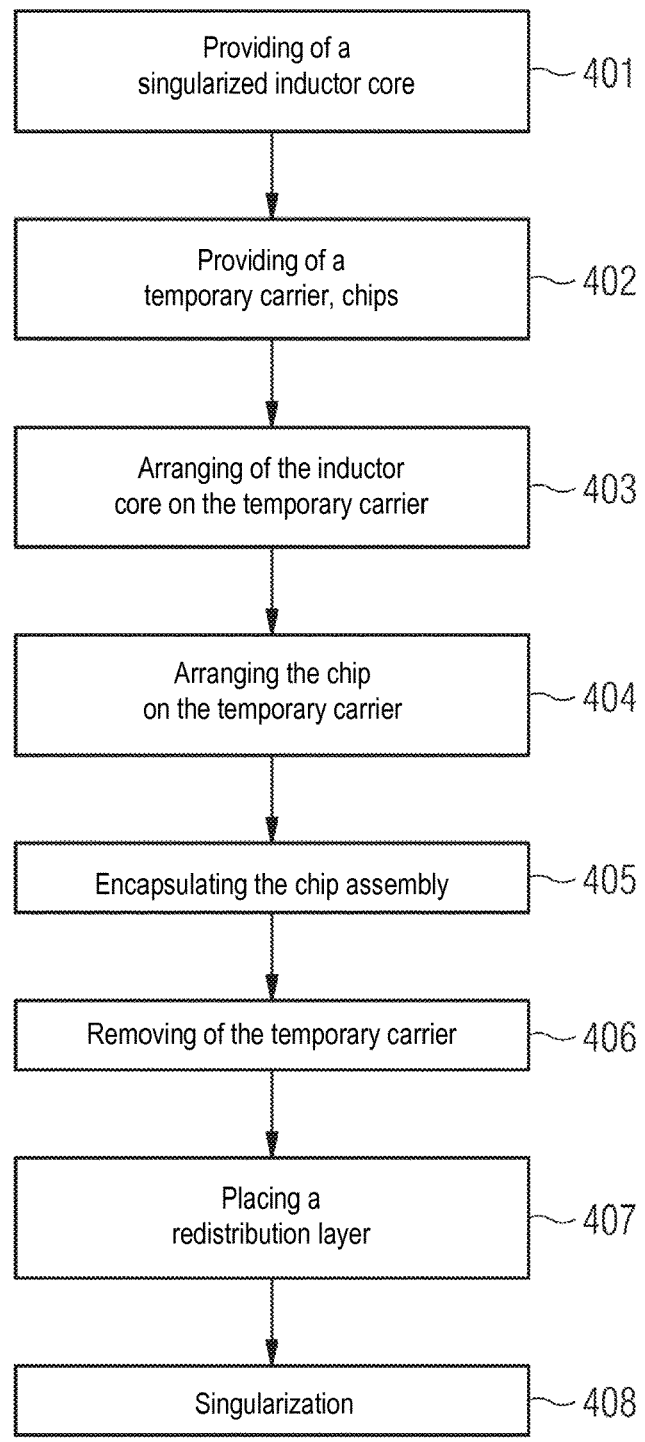
FIG. 4 is a flow chart for a method for producing a chip assembly according to an exemplary embodiment.

FIG. 4 is a flow chart for a method for producing a chip assembly according to an exemplary embodiment. In particular, the method comprises the provision of an isolated or single inductor core (step 401), which may be prepared, for example by a method according to FIG. 3. Preferably, the inductor core is provided on a dicing tape on the panel. Other components such as a temporary carrier and chips are also provided (step 402). In a subsequent step, an inductor core is added, preferably rotated by 90° and placed or assembled on the temporary carrier (step 403). Here, the temporary carrier preferably has a corresponding panel size. The other components, in particular, at least one chip, are also arranged on the temporary carrier (step 404).

After both the inductor core and the at least one chip are assembled on the temporary carrier, this is encapsulated, for example by a molding compound or lamination (step 405). After encapsulation, the temporary carrier is removed (step 406) and a thin film processing step is performed, in which at least a redistribution layer is applied or arranged on the encapsulation (step 407). Preferably, at least one redistribution layer is applied on both an upper side and on an underside of the encapsulation to connect conductors of the inductor core and, if necessary, the contact pads of the chip. Subsequently, singularization or separation is performed (step 408).

FIG. 5 is a flow chart for another method for producing a chip assembly according to an exemplary embodiment. In particular, the method comprises the provision of a singularized or single inductor core (step 501), which may be prepared, for example by a method according to FIG. 3. Other components such as a carrier and chips are also provided (step 502). In a subsequent step, an inductor core is included, preferably rotated by 90° and assembled on the carrier and bonded to terminal pads or conductor tracks, which are formed on the carrier (step 503). The carrier preferably has a corresponding panel size in this case. The other components, in particular, at least one chip, are also arranged on and bonded to the carrier (step 504).

After both the inductor core and the at least one chip are assembled on the carrier, this is encapsulated, for example by a molding compound or lamination (step 505). After encapsulation, the encapsulation is structured, in particular, parts of the encapsulation are removed or opened, wherein, for example, vias (vertical interconnect accesses) are formed (step 506). Metallization can subsequently be performed (step 507), by which contacts can be formed. Subsequently or alternatively, a thin film processing step can be carried out, in which at least a redistribution layer is applied or arranged on the encapsulation (step 508) in order to connect conductors of the inductor core and, if necessary, the contact pads of the chip. Singularization or separation is subsequently performed (step 509).

In summary, an inductor core may thus be provided as a semi-finished or a primary product according to an exemplary embodiment. The inductor core here has a magnetic core and supports a first plurality of conductors and a second plurality of conductors, which are assembled on sides of the magnetic core, facing or turned away from each other. The conductors can then be connected with each other by a redistribution layer to form windings of a coil. Thus, an inductor or an inductance may be formed, which has a higher inductance compared to the other inductors integrated in the RDL (planar), since a magnetic core may easily be formed. Thus, it may be possible to provide an adequate energy buffer for DC-DC converters by the inductance or the inductor.

While the invention has been particularly illustrated and described with reference to specific exemplary embodiments, the skilled person understands that various changes in terms of form and detail may be made without departing from the spirit and scope of the invention as defined by the appended claims. Thus, the scope of protection is indicated by the appended claims, and all changes which come within the meaning and range of equivalency of the claims are to be included.

The invention claimed is:

1. Chip assembly, comprising:
   a carrier comprising a first part and a second part;
   at least one chip comprising at least one contact pad, which is arranged on the first part of the carrier;
   an inductor core, comprising a magnetic core comprising a first conductors on a first surface of the magnetic core and a second conductors on a second surface of the magnetic core, which is opposite the first surface of the magnetic core;
   wherein the inductor core is arranged on the second part of the carrier;
   wherein the first conductors and the second conductors are electrically connected with each other by respective conductor tracks, wherein at least on the upper side of the inductor core the conductor tracks are part of a redistribution layer;
   wherein the first surface of the inductor core is perpendicular to a main surface of the carrier; and
   wherein the at least one contact pad of the chip is electrically connected with one of the first and the second electrical conductors of the inductor by an intermediate conductor.

2. Chip assembly according to claim 1, wherein the chip assembly is encapsulated.

3. Chip assembly according to claim 1, wherein the inductor comprises a set of electrical conductors, which is divided into a first plurality of electrical conductors and a second plurality of electrical conductors, wherein the first plurality of electrical conductors is arranged on the first surface and the second plurality of electrical conductors is arranged on the second surface.

4. Chip assembly according to claim 3,
   wherein at least one of the first plurality of electrical conductors is electrically connected with two of the second plurality of electrical conductors.

5. Chip assembly, comprising:
   at least one chip comprising at least one contact pad,
   an inductor core, comprising a magnetic core and a first conductors on a first surface of the magnetic core and a second conductors on a second surface of the magnetic core, which is opposite the first surface of the magnetic core;
   wherein the chip and the inductor core are embedded in an encapsulant and the first conductors and the second conductors are electrically connected via respective conductive tracks, wherein at least on the upper side of the inductor core the conductor tracks are part of a redistribution layer;
   wherein the at least one contact pad of the chip is electrically connected with one of the first and the second electrical conductors of the inductor core by an intermediate conductor.

6. Chip assembly according to claim 5, wherein the redistribution layer is arranged in the encapsulant.

* * * * *